United States Patent
Inoue et al.

(10) Patent No.: US 6,465,368 B2
(45) Date of Patent: Oct. 15, 2002

(54) METHOD OF MANUFACTURING INSULATING FILM-FORMING MATERIAL, THE INSULATING FILM-FORMING MATERIAL, AND INSULATING FILM

(75) Inventors: Yasutake Inoue, Tsukuba (JP); Junji Kawai, Tsuchiura (JP); Michinori Nishikawa, Tsukuba (JP); Kinji Yamada, Tsukuba (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/849,302

(22) Filed: May 7, 2001

(65) Prior Publication Data

US 2001/0051446 A1 Dec. 13, 2001

(30) Foreign Application Priority Data

May 16, 2000 (JP) ........................................ 2000-143870

(51) Int. Cl.$^7$ .......................... H01L 21/31; C08G 77/00; C08G 77/06
(52) U.S. Cl. ...................... 438/780; 438/781; 428/41.4; 528/10; 528/12
(58) Field of Search .................................. 438/780, 781; 428/41.4; 528/10, 12

(56) References Cited

U.S. PATENT DOCUMENTS 3,872,145 A  *  3/1975  Breysse et al. .......... 260/448.2
5,973,095 A  *  10/1999  Hacker et al. ................. 528/12

* cited by examiner

*Primary Examiner*—Alexander Ghyka
(74) *Attorney, Agent, or Firm*—Oblon, Spivak, McClelland, Maier & Neustadt, P.C.

(57) ABSTRACT

A method of manufacturing an insulating film-forming material comprising dissolving an inorganic polymer compound or an organic polymer compound in an organic solvent having a solubility in water of 100 g/100 cc or less at 20° C., and causing the solution to come in contact with water or an acidic aqueous solution to perform liquid-liquid extraction. The insulating film-forming material has a low metal impurity content and is capable of forming a silica-based film having excellent relative dielectric constant characteristics and low leakage current characteristics.

22 Claims, No Drawings

000
METHOD OF MANUFACTURING INSULATING FILM-FORMING MATERIAL, THE INSULATING FILM-FORMING MATERIAL, AND INSULATING FILM

BACKGROUND OF THE INVENTION

1. Field of the Invention

The present invention relates to a film-forming material and, more particularly, to a film-forming material capable of forming silica-based films as an interlayer dielectric material in the manufacture of semiconductor devices and the like, having only a small metal impurity content, and exhibiting excellent relative dielectric constant characteristics and low leakage current characteristics.

2. Description of the Background Art

Conventionally, silica ($SiO_2$) films formed by a vacuum process such as a CVD process have been extensively used as an interlayer dielectric film in the manufacture of semiconductor devices and the like. In recent years, an SOG (spin on glass) film which is a coating-type insulating film made from a composition containing tetraalkoxysilane hydrolyzate as a major component is used with the objective of forming a homogeneous interlayer dielectric. As high integration of semiconductor devices has advanced, an interlayer dielectric with a low relative dielectric constant made from a composition containing polyorganosiloxane as a major component, which is called an organic SOG, has been developed.

However, demand for further integration and layer multiplication of semiconductor devices requires more excellent electric insulation among conductors. Development of a more excellent interlayer dielectric material having a smaller metal impurity content, a more excellent relative dielectric constant, and lower leakage current characteristics.

A composition comprising fine particles obtained by the condensation of an alkoxysilane in the presence of ammonia (Japanese Patent Applications Laid-open No. 263045/1993 and No. 315319/1993) and a coating solution obtained by the condensation of a basic hydrolyzate of polyalkoxysilane in the presence of ammonia (Japanese Patent Applications Laid-open No. 340219/1999 and No. 340220/1999 have been proposed as materials having a low relative dielectric constant. However, the materials obtained by these methods are not suitable for industrial manufacture because of unstable properties of the reaction products, a high metal impurity content, and fluctuation of film characteristics such as relative dielectric constant characteristics and low leakage current characteristics.

An object of the present invention is to provide a method of manufacturing a film-forming material having only a small metal impurity content and exhibiting excellent relative dielectric constant characteristics and low leakage current characteristics, industrially and in a stable manner.

SUMMARY OF THE INVENTION

Specifically, the present invention provides a method of manufacturing an insulating film-forming material comprising dissolving an inorganic polymer compound or an organic polymer compound in an organic solvent having a solubility in water of 100 g/100 cc or less at 20° C. (hereinafter referred to as "specific organic solvent"), and causing the solution to come in contact with water or an acidic aqueous solution to perform liquid—liquid extraction.

The present invention further provides a method of forming a film comprising applying the film-forming composition obtained by the above method to a substrate and heating the applied composition.

The present invention also provides an insulating film obtained by the above film forming method.

Other objects, features and advantages of the invention will hereinafter become more readily apparent from the following description.

DETAILED DESCRIPTION OF THE INVENTION AND PREFERRED EMBODIMENTS

Inorganic Polymer Compound

In the present invention, the inorganic polymer compound is a compound obtained by the hydrolysis and condensation of at least one silane compound selected from the compounds shown by the following formula (1) (hereinafter referred to as "compound (1)"), the compounds shown by the following formula (2) (hereinafter referred to as "compound (2)"), and the compounds shown by the following formula (3) (hereinafter referred to as "compound (3)") in the presence of a catalyst.

　　(1)

wherein $R^1$ is a hydrogen atom, fluorine atom, or monovalent organic group, $R^1$ is a monovalent organic group, and a is an integer from 1 to 2.

　　(2)

wherein $R^2$ represents a monovalent organic group,

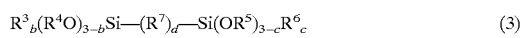　　(3)

wherein $R^3$, $R^4$, $R^5$, and $R^6$ individually represent a monovalent organic group, b and c individually represent an integer from 0 to 2, $R^7$ represents an oxygen atom, a phenylene group, or a group —$(CH_2)_n$— (wherein n is an integer from 1 to 6), and d is 0 or 1.

Compound (1)

As a monovalent organic group represented by R or $R^1$ in the above formula (1), an alkyl group, aryl group, allyl group, glycidyl group, and the like can be given. As R in the formula (1), a monovalent organic group, particularly an alkyl group and phenyl group, are preferable.

The alkyl groups having 1–5 carbon atoms such as a methyl group, ethyl group, propyl group, butyl group, and the like are preferably used. These alkyl groups may be either linear or branched, and the hydrogen atoms on the alkyl groups may be replaced with fluorine atoms.

As aryl groups used in the formula (1), a phenyl group, naphthyl group, methylphenyl group, ethyl phenyl group, chlorophenyl group, bromophenyl group, fluorophenyl group, and the like can be given.

The following compounds are given as shown as specific examples represented by the formula (1):
trimethoxysilane, triethoxysilane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, fluorotriphenoxysilane, methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n- propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, i-propyltriethoxysilane, i-propyltri-n-propoxy silane, i-propyltri-iso-propoxysilane, i-propyltri-n-butoxysilane, i-propyltri-sec-butoxysilane, i-propyltri-tert-butoxysilane, i-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyl-tri-n-propoxysilane, sec-butyltri-iso-propoxysilane, sec-butyltri-n-butoxysilane, sec-butyltri-sec-butoxysilane, sec-butyltri-tert-butoxysilane, sec-butyl-triphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxy silane, phenyltri-iso-propoxysilane, phenyltri-n-butoxysilane, phenyltri-sec-butoxysilane, phenyltri-tert-butoxysilane, phenyltriphenoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, γ-trifluoropropyltriethoxysilane, dimethyldimethoxysilane, dimethyldiethoxysilane, dimethyldi-n-propoxysilane, dimethyldi-iso-propoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldi-iso-propoxysilane, diethyldi-n-butoxysilane, diethyldi-sec-butoxysilane, diethyldi-tert-butoxysilane, diethyldi-phenoxysilane, di-n-propyldimethoxysilane, di-n-propyldiethoxysilane, di-n-propyl-di-n-propoxysillane di-n-propyl-di-iso-propoxysilane, di-n-propyldi-n-butoxysilane, di-n-propyldi-sec-butoxysilane, di-n-propyldi-tert-butoxysilane, di-n-propyldi-phenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxysilane, di-iso-propyldi-sec-butoxysilane, di-iso-propyldi-tert-butoxysilane, di-iso-propyldi-phenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxysilane, di-n-butyldi-tert-butoxysilane, di-n-butyldi-phenoxysilane, di-sec-butyldimethoxysilane, di-sec-butyldiethoxysilane, di-sec-butyldi-n-propoxysilane, di-sec-butyldi-iso-propoxysilane, di-sec-butyldi-n-butoxysilane, di-sec-butyldi-sec-butoxysilane, di-sec-butyldi-tert-butoxysilane, di-sec-butyldi-phenoxysilane, di-tert-butyldimethoxysilane, di-tert-butyldiethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldi-ethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, divinyltrimethoxysilane, and the like.

Of these, preferable compounds are methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, and the like.

These compounds may be used either individually or in combination of two or more.

Compound (2)

As examples of the monovalent organic groups represented by $R^2$ in the above formula (2), the same groups as given for the organic groups in the above formula (1) can be given.

Specific examples of the compound of the formula (2) include tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, and the like.

Compound (3)

As examples of the monovalent organic groups represented by $R^3$ to $R^6$ in the above formula (3), the same groups as given for the organic groups in the above formula (1) can be given.

As examples of the compounds having an oxygen atom for $R^7$ in the formula (3) hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3- tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane can be given.

Of these, preferable compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, and the like.

As examples of the compounds having d=0 in the formula (3) hexamethoxydisiloxane, hexaethoxydisiloxane, hexaphenoxydisiloxane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane can be given.

Of these, preferable compounds are hexamethoxydisiloxane, hexaethoxydisiloxane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

The following compounds can be given as specific examples of the compound of the formula (3) having the group —(CH2)$_n$— for $R^7$: bis(trimethoxysilyl)methane, bis(triethoxysilyl)methane, bis(tri-n-propoxysilyl)methane, bis(tri-i-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-i-propoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-i-propoxymethylsilyl)-1-(tri-i-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-i-propoxymethylsilyl)-2-(tri-i-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1- (di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-i-propoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-i-propoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-i-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-i-propoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-i-propoxysilyl)benzene, 1,4-bis(tri-n-butoxysilyl)benzene, 1,4-bis(tri-sec-butoxysilyl)benzene, 1,4-bis(tri-t-butoxysilyl)benzene, and the like.

Of these, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

In the present invention, one or more of the above compounds (1), (2), and (3) may be used as the inorganic compound.

In the hydrolysis condensation of at least one silane compound selected from the above compounds (1)–(3), water is added preferably in the amount of 0.5 to 150 mols, and more preferably 0.5 to 130 mols, per one mole of the compounds (1)–(3). If the amount of water added is less than 0.5 mol, cracking resistance of the coating may be impaired; if more than 150 mols, deposition or gelling of polymers may occur during the hydrolysis condensation reaction.

In the preparation of the inorganic polymer compound of the present invention, a catalyst may be used for the hydrolysis and condensation reaction of at least one silane compound selected from the above compounds (1)–(3).

Catalyst

Metal chelating compounds, acid catalysts, and alkali catalysts, and the like can be used as the catalyst.

The following compounds can be given as examples of the metal chelating compound: titanium chelate compounds such as triethoxy.mono(acetylacetonate)titanium, tri-n-propoxy.mono(acetylacetonate)titanium, tri-i-propoxy.mono(acetylacetonate)titanium, tri-n-butoxy.mono(acetylacetonate)titanium, tri-sec-butoxy.mono(acetylacetonate)titanium, tri-t-butoxy.mono(acetylacetonate)titanium, diethoxy.bis(acetylacetonate)titanium, di-n-propoxy.bis(acetylacetonate)titanium, di-i-propoxy.bis(acetylacetonate)titanium, di-n-butoxy.bis(acetylacetonate)titanium, di-sec-butoxy.bis(acetylacetonate)titanium, di-t-butoxy.bis(acetylacetonate)titanium, monoethoxy.tris(acetylacetonate)titanium, mono-n-propoxy.tris(acetylacetonate)titanium, mono-i-propoxy.tris(acetylacetonate)titanium, mono-n-butoxy.tris(acetylacetonate)titanium, mono-sec-butoxy.tris(acetylacetonate)titanium, mono-t-butoxy.tris(acetylacetonate)titanium, tetrakis(acetylacetonate)titanium, triethoxy.mono(ethylacetoacetate)titanium, tri-n-propoxy.mono(ethylacetoacetate)titanium, tri-i-propoxy.mono(ethylacetoacetate)titanium, tri-n-butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, di-i-propoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, mono-i-propoxy.tris(ethylacetoacetate)titanium, mono-n-butoxy.tris(ethylacetoacetate)titanium, mono-sec-butoxy.tris(ethylacetoacetate)titanium, mono-t-butoxy.tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy.mono(acetylacetonate)zirconium, tri-n-propoxy.mono(acetylacetonate)zirconium, tri-i-propoxy.mono(acetylacetonate)zirconium, tri-n-butoxy.mono(acetylacetonate)zirconium, tri-sec-butoxy.mono(acetylacetonate)zirconium, tri-t-butoxy.mono(acetylacetonate)zirconium, diethoxy.bis(acetylacetonate)zirconium, di-n-propoxy.bis(acetylacetonate)zirconium, di-i-propoxy.bis(acetylacetonate)zirconium, di-n-butoxy.bis(acetylacetonate)zirconium, di-sec-butoxy.bis(acetylacetonate)zirconium, di-t-butoxy.bis(acetylacetonate)zirconium, monoethoxy.tris(acetylacetonate)zirconium, mono-n-propoxy.tris(acetylacetonate)zirconium, mono-i-propoxy.tris(acetylacetonate)zirconium, mono-n-butoxy.tris(acetylacetonate)zirconium, mono-sec-butoxy.tris(acetylacetonate)zirconium, mono-t-butoxy.tris(acetylacetonate)zirconium, tetrakis(acetylacetonate)zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxyc.bis(ethylacetoacetate)zirconium, di-n-propoxy.bis(ethylacetoacetate)zirconium, di-i-propoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, mono-i-propoxy.tris(ethylacetoacetate)zirconium, mono-n-butoxy.tris(ethylacetoacetate)zirconium, mono-sec-butoxy.tris(ethylacetoacetate)zirconium, mono-t-butoxy.tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum.

Of these catalysts, titanium and/or aluminum chelating compounds are preferable, with particularly preferable catalysts being titanium chelating compounds.

These metal chelating compounds may be used either individually or in combination of two or more.

As the acid catalyst, inorganic acids such as hydrochloric acid, nitric acid, sulfuric acid, hydrofluoric acid, and phosphoric acid, boric acid, and oxalic acid; organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, hydrolyzate of glutaric acid, hydrolyzate of maleic anhydride, and hydrolyzate of phthalic anhydride can be given. Of these organic acids are more preferable.

These acid catalysts may be used either individually or in combination of two or more.

As alkali catalysts, sodium hydroxide, potassium hydroxide, lithium hydroxide, pyridine, pyrrole, piperazine, pyrrolidine, piperidine, picoline, mono ethanolamine, diethanolamine, dimethyl monoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, pentylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimetylimidine, 1-amino-3-methylbutane, dimethylglycine, 3-amino-3-methylamine, and the like can be given. Organic amines are particularly preferable. In particular, ammonia, alkylamines, and tetraalkylammonium hydroxide are preferable from the viewpoint of excellent adhesion to silica-based substrates.

These alkali catalysts may be used either individually or in combination of two or more.

The amount of the catalyst used is usually 0.00001–10 mols, and preferably 0.00005–5 mols, for one mol of the total amount of the groups represented by $R^1O$—, $R^2O$—, $R^4$—, and $R^5O$— in the compounds (1)–(3). The use of the catalyst in the above range reduces the possibility of polymer deposition and gelling during the reaction.

The proportion of the compound (2) in the total amount of the compounds (1)–(3), in terms of the amount of complete hydrolysis-condensation products of these compounds, is in the range of 5–75 wt %, preferably 10–70 wt %, and more preferably 15–70 wt %. The proportion of the compounds (1) and/or (2) in the total amount of the compounds (1)–(3) is in the range of 95–25 wt %, preferably 90–30 wt %, and more preferably 85–30 wt %. If the amount of the compound (2) in the total amount of the compounds (1)–(3) is in the range of 5–75 wt %, the resulting coating exhibits high modulus of elasticity and low dielectric characteristics.

Preferred hydrolysis condensates are the compound (1) and compound (2) to ensure superior storage stability of the resulting composition.

In the present invention, the hydrolyzate does not necessarily mean a compound in which all of the $R^1O$— groups, $R^2O$— groups, $R^4O$— groups, $R^5O$— groups contained in the compounds (1)–(3) are hydrolyzed, but may include compounds with one of the groups hydrolyzed, compounds with two or more of the groups hydrolyzed, and a mixture of these compounds.

In the same manner, the condensate in the present invention, which means a condensation product in which the silanol groups in the hydrolyzates of the compounds (1)–(3) are bonded to form Si—O—Si bonds, does not necessarily mean a compound in which all silanol groups are condensed, but includes compounds in which only a small amount of silanol groups are condensed, as well as a mixture of compounds with a different degree of condensation.

In the present invention, the complete hydrolysis condensate means any compounds in which all of the $R^1O$— groups, $R^2O$— groups, $R^4$— groups, $R^5O$— groups contained in the compounds (1)–(3) are hydrolyzed into SiOH groups and are completely condensed into a siloxane structure.

Organic Polymer Compound

In the present invention, the organic polymer compound includes aromatic polyarylenes, aromatic polyarylene ethers, and aromatic polyacetylenes.

As examples of the aromatic polyarylene, a polymer shown by the following formula (4) can be given:

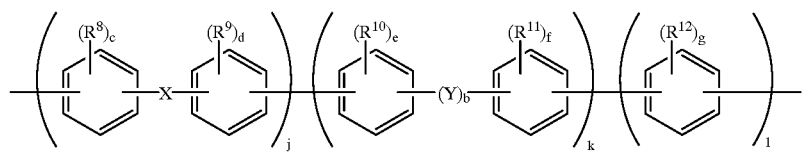

As an example of the aromatic polyarylene ether, a polymer shown by the following formula (5) can be given:

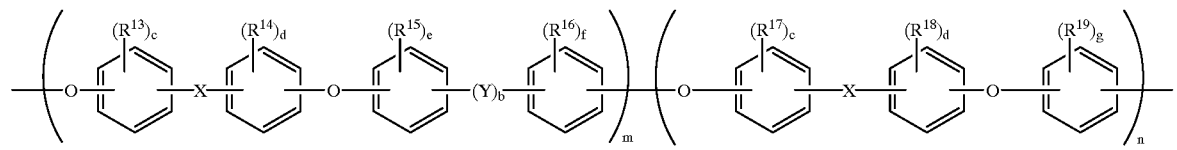

As an example of the aromatic polyacetylene, a polymer containing at least one of the following structures (6) or (7) can be given:

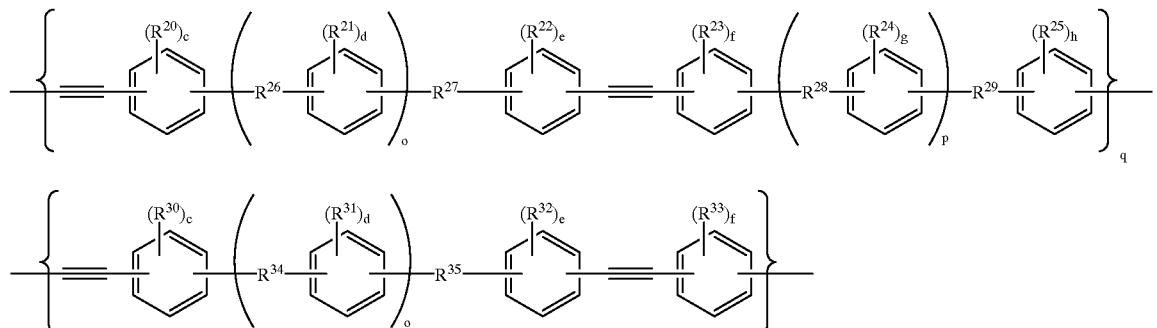

wherein $R^8$ to $R^{25}$ and $R^{30}$ to $R^{31}$ individually represent a hydrocarbon group having 1–20 carbon atoms, cyano group, nitro group, alkoxyl group having 1–20 carbon atoms, or halogen atom; X is a group —CQQ'— (wherein Q and Q' individually represent an alkyl halide group, alkyl group, hydrogen atom, halogen atom, or aryl group), or a fluorenine group; Y, $R^{26}$ to $R^{29}$, and $R^{34}$ to $R^{35}$ individually is a group —O—, —CH$_2$—, —CO—, —COO—, —CONH—, —S—, —SO$_2$—, or a phenylene group; b is 0 or 1; c to i individually indicate an integer from 0 to 4; j is 5–100 mol %, k is 0–95 mol %, and 1 is 0–95 mol % (provided that j+k+1=100 mol %); and m is 0–100 mol % and n is 0–100 mol % (provided that m+n=100 mol %), o is an integer of 0–3, and p is an integer of 0–3.

In the present invention, the above-described inorganic polymer compounds or organic polymers (hereinafter referred to as "polymer components") suitable as an insulating film-forming material are dissolved in the specific organic solvent, and the resulting solution is caused to come in contact with water or an acidic aqueous solution to perform liquid-liquid extraction.

Organic Solvents

The specific organic solvent has a solubility in water at 20° C. of 100 g/100 cc or less, preferably 30 g/100 cc or less, and more preferably 20 g/100 cc or less.

Specific examples of specific organic solvents includes ester solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, propylene glycol monomethyl ether acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylebenzene, i-propylebenzene, and diethylbenzene; and the like. Of these, ester solvents are preferable.

These specific organic solvents may be used either individually or in combination of two or more.

Other solvents may be added to the specific organic solvent to the extent that the effect of the present invention will not be adversely affected.

The following solvents can be given as examples of such other solvents: monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, dipropylene glycol monomethyl ether, dipropylene glycol monoethyl ether, and dipropylene glycol monopropyl ether; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclohexanone, 2-hexanone, methyl cyclohexanone, 2,4-pentane dione, acetonyl acetone, acetophenone, fenchone, acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione; amide solvents such as formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropioneamide, N-methylpyrrolidone, N-formylmorpholine, N-formylpiperidine, N-formylpyrrolidine, N-acetylmorpholine, N-acetylpiperidine, and N-acetylpyrrolidine; ester solvents such as γ-butyrolactone and γ-valerolactone; non-protonic solvents such as acetonitrile, dimethylsulfoxide, N,N,N',N'-tetraethylsulfonamide, hexamethylphosphoric acid triamide, N-methylmorphorone, N-methylpyrrole, N-ethylpyrrole, N-methyl-Δ3-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, 1,3-dimethyltetrahydro-2(1H)-pyrimidinone; and the like.

These other solvents are used in the amount of 0–100 parts by weight for 100 parts by weight of the specific organic solvents. If the amount of the other solvents exceeds 100 parts by weight, separation of the layers in the liquid—liquid extraction tends to be difficult.

These other solvents may be used either individually or in combination of two or more.

The amount of the organic solvents used when the polymer components are dissolved in specific organic solvents is not specifically limited. The use of an unnecessarily large amount of organic solvents may cause operational problems. If the amount of the organic solvents is too small, separation of the polymer and water layer will be difficult when the polymer is treated with water or an acidic aqueous solution. The proportion of the specific organic solvent used is 50–5,000 parts by weight, and preferably 100–4,000 parts by weight, for 100 parts by weight of the polymer components.

The inorganic compounds or organic polymers dissolved in the specific organic solvent are caused to come in contact with water or an acidic aqueous solution for liquid—liquid extraction.

Acidic Aqueous Solutions

Although water alone may be used for extraction, an acidic aqueous solution prepared by adding an acid to water to make the pH 5 or less is more preferable. If the aqueous solution is too acidic, the polymer components may be adversely effected. Therefore, the aqueous solution is usually about pH 0 or more, and preferably pH 1–5.

As the acid used for preparing the acidic aqueous solution, inorganic acids such as hydrochloric acid, nitric acid, sulfuric acid, hydrofluoric acid, and phosphoric acid, boric acid, and oxalic acid; organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, hydrolyzate of glutaric acid, hydrolyzate of maleic anhydride, and hydrolyzate of phthalic anhydride can be given. Of these, nitric acid, acetic acid, and organic acids are preferable. Particularly preferable acids are nitric acid, acetic acid, and organic dicarboxylic acids.

These acids may be used either individually or in combination of two or more.

In the present invention, water or an acidic aqueous solution may be added to the polymer components, or the polymer components may be added to the water or acidic aqueous solution.

In conformity with the object of the present invention, the water or acidic aqueous solution used should have a minimal metal content, and preferably be ion-exchanged water or distilled water having an electric resistance of 10 MΩ/cm or more. Ion-exchanged water is preferably used as is. Weakly acidic water prepared by the addition of an acid to water with a minimal metal content is also preferable.

Although there are no specific limitations to the amount of water or acidic aqueous solution, too small an amount increases the number of extraction operations for removing metal. Too large an amount of water or acidic aqueous solution may cause a problem associated with handling too large an amount of liquid materials.

A suitable amount of water or acidic aqueous solution is 100–3,000 parts by weight, and preferably 150–2,500 parts by weight, for 100 parts by weight of the polymer components.

The liquid—liquid extraction is usually carried out by stirring a solution of the polymer components and an extraction medium, i.e. water or acidic aqueous solution, at 5–60° C., preferably 10–50° C., and allowing the extractor to stand still.

In this manner, the polymer component solution layer is separated from the water layer, causing metal ions contained in the polymer solution to move into the water layer. In this instance, the degree of separation of the polymer solution layer from the water layer can be improved by using a centrifugal separator and the like.

Although the metal content of the polymer component solution can be reduced by this treatment, reduction of the metal content by repetition of the procedure, which consists of pouring the polymer component solution layer obtained by the extraction into water or an acidic aqueous solution, followed by stirring, standing, and layer separation, is more preferable. When an acidic aqueous solution is used for the liquid-liquid extraction, it is desirable to repeat extraction several times using water to remove the acid.

As required, a solvent for forming coating films may be added to the polymer component solution thus obtained. Then, the residual water and specific organic solvent is removed from the polymer component solution by vacuum distillation or the like.

At least one solvent selected from the group consisting of alcohol solvents, ketone solvents, amide solvents, ester solvents, and non-protonic solvents can be used as the solvent for forming coating films.

The following solvents can be given as examples of alcohol solvents: monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, and the like.

These alcohol solvents may be used either individually or in combination of two or more.

Given as ketone solvents are acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclohexanone, methyl cyclohexanone, 2,4-pentane dione, acetonyl acetone, acetophenone, and fenchone, as well as β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione, and the like.

These ketone solvents may be used either individually or in combination of two or more.

As amide solvents, formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropioneamide, N-methylpyrrolidone, N-formylmorpholine, N-formylpiperidine, N-formylpyrrolidine, N-acetylmorpholine, N-acetylpiperidine, N-acetylpyrrolidine, and the like can be given.

These amide solvents may be used either individually or in combination of two or more.

As ester solvents, diethyl carbonate, ethylene carbonate, propylene carbonate, diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given.

These ester solvents may be used either individually or in combination of two or more.

As examples of the non-protonic solvent, acetonitrile, dimethylsulfoxide, N,N,N',N'-tetraethylsulfonamide, hexamethylphosphoric acid triamide, N-methylmorphorone, N-methylpyrrole, N-ethylpyrrole, N-methyl-Δ-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, 1,3-dimethyltetrahydro-2(1H)-pyrimidinone, and the like can be given.

Among the above-described organic solvents, the organic solvents represented by the following formula (4) are particularly preferable.

$$R^{10}O(CHCH_3CH_2O)_gR^{11} \quad (4)$$

wherein $R^{10}$ and $R^{11}$ are individually a hydrogen atom, alkyl group having 1–4 carbon atoms, or the group $CH_3CO$—, and e is an integer of 1–2.

The above organic solvents (C) may be used either individually or in combination of two or more.

Other Additives

The film-forming composition of the present invention may further comprise other components such as β-diketones, colloidal silica, colloidal alumina, organic polymers, surfactants, silane coupling agents, radical generating agents, triazene compounds, and the like.

As β-diketone, acetylacetone, 2,4-hexane dione, 2,4-heptane dione, 3,5-heptane dione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione, and the like can be given. Of these, acetylacetone, 2,4-hexanedione, 2,4-heptanedione, and 3,5-heptanedione are preferable.

These β-diketones can be used either individually or in combination of two or more.

Colloidal silica is a dispersion of high purity silicic anhydride in a hydrophilic organic solvent, for example, with a solid content of about 10–40 wt %, wherein silica particles with an average diameter of 5–30 nm, and preferably 10–20 nm, are dispersed. Such colloidal silica is commercially available, for example, as methanol silica sol or iso-propanol silica sol (manufactured by Nissan Chemical Industries, Ltd.) or Oscal™ (manufactured by Catalysts & Chemicals Ind. Co., Ltd.).

The above colloidal alumina is commercially available, for example, as Alumina Sol 520™, Alumina Sol 100™, or Alumina Sol 200™ (manufactured by Nissan Chemical Industries, Ltd.), and Alumina Clear Sol™, Alumina Sol 10™, or Alumina Sol 132™ (manufactured by Kawaken Fine Chemicals Co., Ltd.).

As examples of organic polymers, compounds with a sugar chain structure, vinyl amide polymers, (meth)acrylic polymers, aromatic vinyl compounds, dendolimers, polyimides, polyamic acids, polyarylenes, polyamides, polyquinoxalines, polyoxadizoles, fluorine-containing polymers, compounds with a polyalkylene oxide structure, and the like can be given.

As the polyalkylene oxide structure, a polymethylene oxide structure, a polyethylene oxide structure, polypropylene oxide structure, polytetramethylene oxide structure, polybutylene oxide structure, and the like can be given.

Specific examples of the compound having a polyalkylene oxide structure include ether compounds such as polyoxymethylene alkyl ether, polyoxyethylene alkyl ether, polyoxyethylene alkylphenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; and ester compounds such as polyethylene glycol fatty acid ester, ethylene glycol fatty acid ester, fatty acid monoglyceride, polyglycerol fatty acid ester, sorbitan fatty acid ester, propylene glycol fatty acid ester, and sucrose fatty acid ester.

As a polyoxyethylene polyoxypropylene block copolymer, the compounds having the following block structure can be given:

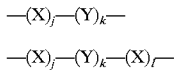

wherein X indicates a group —$CH_2CH_2O$—, Y indicates a group —$CH_2CH(CH_3)O$—, and j is a number from 1 to 90, k is a number from 10 to 99, and 1 is a number from 0 to 90.

Of these, ether-type compounds such as polyoxyethylene alkyl ethers, polyoxyethylene polyoxypropylene block copolymers, polyoxyethylene polyoxypropylene alkyl ethers, polyoxyethylene glycerides, polyoxyethylene sorbitan fatty acid esters, polyoxyethylene sorbitol fatty acid esters, and the like are preferable.

These compounds can be used either individually or in combination of two or more.

As examples of surfactants, nonionic surfactants, anionic surfactants, cationic surfactants, and amphoteric surfactants can be given. These may be a fluorine-containing surfactant, silicon-containing surfactant, polyalkylene oxide surfactant, poly(meth)acrylate surfactant, or the like. Of these, fluorine-containing surfactants and silicon-containing surfactants are preferable.

As examples of fluorine-containing surfactants, compounds having a fluoroalkyl or fluoroalkylene group at the molecular chain terminal, or in the main chain or side chain can be given. Specific examples of such compounds are: 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecyl sulfonate, 1,1,2,2,8,8,9,9,10,10-decafluorododecane, 1,1,2,2,3,3-hexafluorodecane, N-3-

(perfluorooctanesulfonamide)-propyl-N,N'-dimethyl-N-carboxymethylene ammonium betaine, perfluoroalkyl sulfonamide propyltrimethyl ammonium salt, perfluoroalkyl-N-ethylsulfonyl glycine salt, bis(N-perfluorooctylsulfonyl-N-ethylaminoethyl)phosphate, and monoperfluoroalkylethyl phosphate.

As examples of commercially available products of fluorine-containing surfactants, MEGAFAC F142D, F172, F173, F183 (manufactured by Dainippon Ink and Chemicals, Inc.), Eftop EF301, EF303, EF352 (manufactured by Sin-Akita Kasei Co., Ltd.). Fluorad FC-430, FC-431 (manufactured by Sumitomo 3M Co., Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), and NBX-15 (manufactured by NEOS Co., Ltd.) can be given. Of these products, MEGAFAC F172, BM-1000, BM-1100, and NBX-15 are particularly preferable.

As silicon-containing surfactants, SH7PA, SH21PA, SH28PA, SH30PA, ST94PA (manufactured by Toray-Dow Corning Silicone Co., Ltd.) and the like can be used. Of these, SH28PA and SH30PA are particularly preferable. The amount of the surfactants to be added is usually 0.0001–10 parts by weight for 100 parts by weight of the specific organic solvent (complete hydrolysis condensate).

These surfactants can be used either individually or in combination of two or more.

As examples of silane coupling agents, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3,6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane can be given.

These silane coupling agents can be used either individually or in combination of two or more.

The following compounds can be given as radical generating agents: iso-butyrylperoxide, α,α'-bis(neodecanoylperoxy)diisopropylbenzene, cumylperoxy neodecanoate, di-n-propylperoxy dicarbonate, diisopropylperoxy dicarbonate, 1,1,3,3-tetramethylbutylperoxy neodecanoate, bis(4-t-butylcyclohexyl)peroxy dicarbonate, 1-cyclohexyl-1-methylethylperoxy neodecanoate, di-2-ethoxyethylperoxy dicarbonate, di(2-ethylhexylperoxy) dicarbonate, t-hexylperoxyneodecanoate, dimethoxybutylperoxy dicarbonate, di(3-methyl-3-methoxybutylperoxy) dicarbonate, t-butylperoxyneodecanoate, 2,4-dichlorobenzoylperoxide, t-hexylperoxypivalate, t-butylperoxypivalate, 3,5,5-trimethylhexanoylperoxide, octanoylperoxide, lauroylperoxide, stearoylperoxide, 1,1,3,3-tetramethylbutylperoxy 2-ethylhexanoate, succinicperoxide, 2,5-dimethyl-2,5-di(2-ethylhexanoylperoxy)hexane, 1-cyclohexyl-1-methylethylperoxy 2-ethylhexanoate, t-hexylperoxy 2-ethylhexanoate, t-butylperoxy 2-ethylhexanoate, m-tolyl and benzoyl peroxide, benzoyl peroxide, t-butylperoxy isobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexylperoxyisopropyl monocarbonate, t-butylperoxy maleic acid, t-butylperoxy-3,3,5-trimethylhexanoate, t-butylperoxylaurate, 2,5-dimethyl-2,5-di(m-toluoylperoxy)hexane, t-butylperoxyisopropyl monocarbonate, t-butylperoxy 2-ethylhexylmonocarbonate, t-hexylperoxybenzoate, 2,5-dimethyl-2,5-di(benzoylperoxy)hexane, t-butylperoxyacetate, 2,2-bis(t-butylperoxy)butane, t-butylperoxybenzoate, n-butyl-4,4-bis(t-butylperoxy)valerate, di-t-butylperoxyiso-phthalate, α,α'-bis(t-butylperoxy)diisopropylbenzene, dicunylperoxide, 2,5-dimethyl-2,5-di(t-butylperoxy)hexane, t-butylcumylperoxide, di-t-butylperoxide, p-menthanehydroperoxide, 2,5-dimethyl-2,5-di(t-butylperoxy)hexin-3, diisopropylbenzenehydroperoxide, t-butyltrimethylsilylperoxide, 1,1,3,3-tetramethylbutylhydroperoxide, cumenehydroperoxide, t-hexylhydroperoxide, t-butylhydroperoxide, 2,3-dimethyl-2,3-diphenylbutane, and the like.

The amount of radical generating agents used is preferably from 0.1–10 parts by weight for 100 parts by weight of the polymers.

These radical generating agents can be used either individually or in combination of two or more.

The following compounds can be given as examples of triazene compounds: 1,2-bis(3,3-dimethyltriazenyl)benzene, 1,3-bis(3,3-dimethyltriazenyl)benzene, 1,4-bis(3,3-dimethyltriazenyl)benzene, bis(3,3-dimethyltriazenylphenyl)ether, bis(3,3-dimethyltriazenylphenyl)methane, bis(3,3-dimethyltriazenylphenyl)sulfone, bis(3,3-dimethyltriazenylphenyl)sulfide, 2,2-bis[4-(3,3-dimethyltriazenylphenoxy)phenyl]-1,1,1,3,3,3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl))-9,9-bis[4-(3,3-dimethyltriazenyl)phenyl]fluorene, 2,7-bis(3,3-dimethyltriazenyl)-9,9-bis[3-methyl-4-(3,3-dimethyltriazenyl)phenyl]fluorene, 2,7-bis(3,3-dimethyltriazenyl)-9,9-bis[3-phenyl-4-(3,3-dimethyltriazenyl)phenyl]fluorene, 2,7-bis(3,3-dimethyltriazenyl)-9,9-bis[3-propenyl-4-(3,3-dimethyltriazenyl)phenyl]fluorene, 2,7-bis(3,3-dimethyltriazenyl)-9,9-bis[3-fluoro-4-(3,3-dimethyltriazenyl)phenyl]fluorene, 2,7-bis(3,3-dimethyltriazenyl)-9,9-bis[3,5-difluoro-4-(3,3-dimethyltriazenyl)phenyl]fluorene, and 2,7-bis(3,3-dimethyltriazenyl)-9,9-bis[3-trifluoromethyl-4-(3,3-dimethyltriazenyl)phenyl]fluorene.

These triazene compounds can be used either individually or in combination of two or more.

The total solid content in the composition of the present invention thus obtained may be appropriately adjusted according to the target application, preferably, in the range of 2–30 wt %. The total solid content in the range of 2–30 wt % not only ensures production of a coated film thickness in an appropriate range, but also ensures excellent storage stability of the composition.

If required, the total solid content may be adjusted by concentrating the composition or diluting the composition with an organic solvent (D).

When the composition of the present invention is applied to a substrate such as a silicon wafer, $SiO_2$ wafer, or SiN wafer, a coating method such as spin coating, dip coating, roll coating, or spray coating can be used.

A coated film with a dry thickness of about 0.05–2.5 μm is obtained by a single application, and about 0.1–5.0 μm is obtained by one further application of the composition of the present invention. The coated film is then dried at an ordinary temperature or at about 80–600° C. for 5–240 minutes, thereby forming a glass-like or macro polymer insulating film.

A hot plate, oven, furnace, and the like can be used for heating the coated film in air, nitrogen or argon, under vacuum, or under reduced pressure in which the oxygen concentration is controlled.

The coating films can also be formed by radiation such as ultraviolet rays or electron beams.

An appropriate measure such as step-wise heating, selection of atmosphere such as use of nitrogen, air, oxygen, reduced pressure, etc., may be optionally employed to control the rate of curing of the coated films.

The relative dielectric constant of the silica-based film of the present invention is usually 3.0–1.2, preferably 3.0–1.8, and still more preferably 3.0–2.0.

Due to a low relative dielectric constant, excellent oxygen plasma resistance, and anti-crack properties after post curing treatment, the interlayer dielectric film of the present invention is useful for many applications such as an interlayer dielectric or etching stopper membrane for semiconductor devices such as LSI, system LSI, DRAM, SDRAM, RDRAM, and D-RDRAM, an overcoat such as a surface coating for semiconductor devices, an intermediate layer in the semiconductor preparation process using multiple layer resists, an interlayer dielectric of multiple layer interconnecting substrates, and an overcoat and insulation film for a liquid crystal display element, and the like.

EXAMPLES

The present invention will now be described in more detail by way of examples. These examples illustrate an embodiment of the present invention and should not be construed as limiting the present invention.

In the following examples and comparative examples, "parts" and "%" respectively refer to "parts by weight" and "wt %" unless otherwise indicated.

Measurements and evaluations in the examples and comparative examples were carried out as follows.
Weight Average Molecular Weight (Mw)
 Measured by gel permeation chromatography (GPC) under the following conditions.
Samples: 1 g of the hydrolysis-condensate was dissolved in 100 cc of tetrahydrofuran.
Standard polystyrene: Standard polystyrene manufactured by Pressure Chemical Co. of the U.S. was used.
Apparatus: A high temperature high-speed gel osmosis chromatogram (Model 150-CALC/GPC™) manufactured by Waters Co. of the U.S.
Column: SHODEX A-80M™ (length: 50 cm) manufactured by Showa Denko K.K.
Temperature: 40° C.
Flow rate: 1 cc/min.
Relative Dielectric Constant
 The sample composition was coated onto an 8-inch silicon wafer by spin coating. The substrate was dried for 3 minutes at 100° C. on a hot plate, 3 minutes at 200° C. in nitrogen atmosphere, and cured for 25 minutes at 400° C. on a hot plate in nitrogen atmosphere. A sample for evaluation of relative dielectric constant was prepared by forming an aluminum electrode pattern onto the film obtained above by vapor deposition. The relative dielectric constant of the sample was measured by the CV method at a frequency of 100 kHz using an electrode HP 16451B™ and a precision LCR meter HP 4284A™, both manufactured by Yokogawa-Hewlett Packard Co., Ltd.
Leakage Current
 The sample composition was coated onto an 8-inch silicon wafer by spin coating. The substrate was dried for 3 minutes at 100° C. on a hot plate, 3 minutes at 200° C. in nitrogen atmosphere, and cured for 25 minutes at 400° C. on a hot plate in nitrogen atmosphere. Aluminum vapor was deposited onto the resulting substrate, thereby obtaining a test substrate for evaluation of leakage current. The leakage current was determined from the current detected when a voltage of 0.2 MV/cm was applied to the coating using an ampere meter 6517A™ manufactured by Keithley Co., Ltd. The leakage current was evaluated according to the following standard.
 Good: The leakage current was less than $7 \times 10^{-10}$ A/cm$^2$
 Bad: The leakage current was $7 \times 10^{-10}$ A/cm$^2$ or more Synthesis Example 1

77.04 g of methyltrimethoxysilane, 24.05 g of tetramethoxysilane, and 0.48 g of tetrakis(acetylacetonate) titanium were dissolved in 220 g of ethyl acetate (solubility in water at 20° C. 8 g/100 cc) in a separable glass flask. The solution was stirred using a three-one motor and the temperature of the liquid was stabilized at 60° C. Next, 84 g of ion exchange water was added to the solution over one hour. The mixture was stirred for two hours at 60° C. and cooled to room temperature. 100 g of a solution containing methanol and water was removed by evaporation at 50° C. to obtain the reaction solution (1).

The metal content of this solution was analyzed by the flameless atomic absorption method to confirm the metal content of Na (320 ppb), K (22 ppb) Fe (115 ppb), Ca (225 ppb), and Cu (16 ppb).

Synthesis Example 2

205.50 g of methyltrimethoxysilane and 85.51 g of tetramethoxysilane were dissolved in 426 g of propylene glycol monobutyl ether (solubility in water at 20° C.: 6 g/100 cc) in a separable glass flask. The solution was stirred using a three-one motor and the temperature of the liquid was stabilized at 60° C. Next, 182 g of ion exchange water in which 0.013 g of maleic anhydride was dissolved was added to the solution over one hour. The mixture was reacted for two hours at 60° C. and cooled to room temperature. 200 g of a solution containing methanol was removed by evaporation at 50° C. to obtain the reaction solution (2).

The metal content of this solution was analyzed by the flameless atomic absorption method to confirm the metal content of Na (260 ppb), K (20 ppb) Fe (80 ppb), Ca (230 ppb), and Cu (20 ppb).

Synthesis Example 3

5,700 g of distilled ethanol, 1,600 g of ion exchange water, and 900 g of 10% dimethylamine aqueous solution were placed in a separable glass flask, and the mixture was stirred to homogenize. A mixture of 136 g of methyl trimethoxysilane and 209 g of tetraethoxysilane was added to the solution over 30 minutes. The mixture was reacted for two hours while maintaining the solution at 55° C. 20% maleic acid aqueous solution was added to this solution to adjust the pH to 5. 30,000 g of propylene glycol monopropyl ether was added to this solution, and the resulting mixture was evaporated at 50° C. to obtain a 10% concentrate (as completely hydrolyzed condensate). Ethyl acetate was added to adjust this solution to a 5% concentrate (as completely hydrolyzed condensate), thereby obtaining the reaction liquid (3).

The metal content of this solution was analyzed by the flameless atomic absorption method to confirm the metal content of Na (1020 ppb), K (25 ppb) Fe (107 ppb), Ca (630 ppb), and Cu (30 ppb).

Synthesis Example 4

4,709 g of ethanol, 2,325 g of ion exchange water, and 162 g of 25% aqueous solution of tetramethylammonium hydroxide were placed in a separable glass flask, and the mixture was stirred to homogenize. A mixture of 449 g of methyltrimethoxysilane and 686 g of tetraethoxysilane was added to the solution. The mixture was reacted for five hours while maintaining the solution at 52° C. 20% nitric acid aqueous solution was added to this solution to adjust the pH to 4. 30,000 g of propylene glycol monopropyl ether was added to this solution, and the resulting mixture was evaporated at 50° C. to obtain a 10% concentrate (as completely hydrolyzed condensate). Distilled ethyl acetate was added to adjust this solution to a 5% concentrate (as completely hydrolyzed condensate), thereby obtaining the reaction liquid (4).

The metal content of this solution was analyzed by the flameless atomic absorption method to confirm the metal content of Na (1820 ppb), K (60 ppb) Fe (187 ppb), Ca (930 ppb), and Cu (32 ppb).

Synthesis Example 5

4,709 g of ethanol, 2,325 g of ion exchange water, and 162 g of 25% aqueous solution of tetrabutylammonium hydroxide were placed in a separable glass flask, and the mixture was stirred to homogenize. A mixture of 449 g of methyltrimethoxysilane and 686 g of tetraethoxysilane was added to the solution. The mixture was reacted for five hours while maintaining the solution at 52° C. 20% nitric acid aqueous solution was added to this solution to adjust the pH to 4. 30,000 g of propylene glycol monopropyl ether was added to this solution, and the resulting mixture was evaporated at 50° C. to obtain a 10% concentrate (as completely hydrolyzed condensate). Distilled butyl acetate was added to adjust this solution to a 5% concentrate (as completely hydrolyzed condensate), thereby obtaining the reaction liquid (5).

The metal content of this solution was analyzed by the flameless atomic absorption method to confirm the metal content of Na (1420 ppb), K (50 ppb) Fe (189 ppb), Ca (900 ppb), and Cu (28 ppb).

Example 1

100 g of the reaction solution (1) obtained in Synthesis Example 1 and 100 g of distilled water were charged to a separating funnel made of the polyethylene. The mixture was thoroughly shaken and allowed to stand for 30 minutes. A polymer component solution layer and a water layer were obtained respectively as an upper layer and lower layer. The water layer was discharged. 100 g of fresh distilled water was added to the polymer component solution layer, the mixture was shaken and allowed to stand, and then the separated water layer was discharged. This extraction procedure was repeated five times. 200 g of distilled propylene glycol monopropyl ether was added to the resulting polymer component solution, and the resulting mixture was evaporated at 50° C. to remove 120 g of fractions, thereby obtaining composition A.

The metal content of this solution was analyzed by the flameless atomic absorption method to confirm the metal content of Na (4 ppb), K (2 ppb) Fe (7 ppb), Ca (5 ppb), and Cu (1 ppb). The weight average molecular weight of the resulting polymer was 1,900.

The composition A was filtered through a Teflon filter with 0.2 μm pore size to obtain a film-forming composition of the present invention.

The composition was applied to a silicon wafer by spin coating.

The relative dielectric constant of the film thus obtained was evaluated to confirm a low relative dielectric constant of 2.65. The leakage current of the coating film was less than $7 \times 10^{-10}$ A/cm$^2$, confirming a sufficiently low leakage current.

Example 2

100 g of the reaction solution (2) obtained in Synthesis Example 2 and 100 g of a maleic acid aqueous solution (pH 4) were charged to a separating funnel made of the polyethylene. The mixture was thoroughly shaken and allowed to stand for 30 minutes. A polymer component solution layer and a water layer were obtained respectively as an upper layer and lower layer. The water layer was discharged. 100 g of fresh maleic acid aqueous solution (pH 4) was added to the polymer component solution layer, the mixture was shaken and allowed to stand, and then the separated water layer was discharged. This extraction procedure was repeated five times. 50 g of distilled propylene glycol monobutyl ether was added to the resulting polymer component solution, and the mixture was evaporated at 50° C. to remove 50 g of fractions, thereby obtaining composition B.

The metal content of this solution was analyzed by the flameless atomic absorption method to confirm the metal content of Na (3 ppb), K (1 ppb) Fe (6 ppb), Ca (5 ppb), and Cu (1 ppb). The weight average molecular weight of the resulting polymer was 900.

The composition B was filtered through a Teflon filter with 0.2 μm pore size to obtain a film-forming composition of the present invention.

The composition was applied to a silicon wafer by spin coating.

The relative dielectric constant of the film thus obtained was evaluated to confirm a low relative dielectric constant of 2.76. The leakage current of the coating film was less than $7 \times 10^{-10}$ A/cm$^2$, confirming a sufficiently low leakage current.

Example 3

100 g of the reaction solution (3) obtained in Synthesis Example 3 and 100 g of an oxalic acid aqueous solution (pH 4) were charged to a separating funnel made of the polyethylene. The mixture was thoroughly shaken and allowed to stand for 30 minutes. A polymer component solution layer and a water layer were obtained respectively as an upper layer and lower layer. The water layer was discharged. 100 g of fresh oxalic acid aqueous solution (pH 4) was added to the polymer component solution layer, the mixture was shaken and allowed to stand, and then the separated water layer was discharged. 100 g of fresh distilled water was added to the polymer component solution layer, the mixture was shaken and allowed to stand, and then the separated water layer was discharged. 200 g of distilled propylene glycol monobutyl ether was added to the resulting polymer component solution, and the mixture was evaporated at 50° C. to remove 260 g of fractions, thereby obtaining composition C.

The metal content of this solution was analyzed by the flameless atomic absorption method to confirm the metal content of Na (2 ppb), K (1 ppb) Fe (3 ppb), Ca (2 ppb), and Cu (1 ppb). The weight average molecular weight of the resulting polymer was 900,000.

The composition C was filtered through a Teflon filter with 0.2 μm pore size to obtain a film-forming composition of the present invention.

The composition was applied to a silicon wafer by spin coating.

The relative dielectric constant of the film thus obtained was evaluated to confirm a low relative dielectric constant of 2.22. The leakage current of the coating film was less than $7 \times 10^{-10}$ A/cm$^2$, confirming a sufficiently low leakage current.

Example 4

Composition D was prepared in same manner as in Example 3, except that citric acid was used instead of the oxalic acid.

The metal content of this solution was analyzed by the flameless atomic absorption method to confirm the metal content of Na (2 ppb), K (1 ppb) Fe (2 ppb), Ca (1 ppb), and Cu (1 ppb). The weight average molecular weight of the resulting polymer was 910,000.

The composition D was filtered through a Teflon filter with 0.2 μm pore size to obtain a film-forming composition of the present invention.

The composition was applied to a silicon wafer by spin coating.

The relative dielectric constant of the film thus obtained was evaluated to confirm a low relative dielectric constant of 2.24. The leakage current of the coating film was less than $7 \times 10^{-10}$ A/cm$^2$, confirming a sufficiently low leakage current.

Example 5

200 g of the reaction solution (4) obtained in Synthesis Example 4 and 100 g of a maleic acid aqueous solution (pH 4) were charged to a separating funnel made of the polyethylene. The mixture was thoroughly shaken and allowed to stand for 30 minutes. A polymer component solution layer and a water layer were obtained respectively as an upper layer and lower layer. The water layer was discharged. 100 g of fresh maleic acid aqueous solution (pH 4) was added to the polymer component solution layer, the mixture was shaken and allowed to stand, and then the separated water layer was discharged. 100 g of fresh distilled water was added to the polymer component solution layer, the mixture was shaken and allowed to stand, and then the separated water layer was discharged. 200 g of distilled propylene glycol monobutyl ether was added to the resulting polymer component solution, and the mixture was evaporated at 50° C. to remove 360 g of fractions, thereby obtaining composition E.

The metal content of this solution was analyzed by the flameless atomic absorption method to confirm the metal content of Na (2 ppb), K (1 ppb) Fe (2 ppb), Ca (1 ppb), and Cu (1 ppb). The weight average molecular weight of the resulting polymer was 1,500,000.

The composition E was filtered through a Teflon filter with 0.2 μm pore size to obtain a film-forming composition of the present invention.

The composition was applied to a silicon wafer by spin coating.

The relative dielectric constant of the film thus obtained was evaluated to confirm a low relative dielectric constant of 2.16. The leakage current of the coating film was less than $2 \times 10^{-10}$ A/cm$^2$, confirming a sufficiently low leakage current.

Example 6

200 g of the reaction solution (5) obtained in Synthesis Example 5 and 100 g of ion-exchanged water were charged to a separating funnel made of the polyethylene. The mixture was thoroughly shaken and allowed to stand for 30 minutes. A polymer component solution layer and a water layer were obtained respectively as an upper layer and lower layer. The water layer was discharged. 100 g of fresh ion-exchanged water was added to the polymer component solution layer, the mixture was shaken and allowed to stand, and then the separated water layer was discharged. 100 g of fresh distilled water was added to the polymer component solution layer, the mixture was shaken and allowed to stand, and then the separated water layer was discharged. 200 g of distilled propylene glycol monobutyl ether was added to the resulting polymer component solution, and the mixture was evaporated at 50° C. to remove 360 g of fractions, thereby obtaining composition F.

The metal content of this solution was analyzed by the flameless atomic absorption method to confirm the metal content of Na (2 ppb), K (1 ppb) Fe (2 ppb), Ca (1 ppb), and Cu (1 ppb). The weight average molecular weight of the resulting polymer was 1,400,000.

The composition F was filtered through a Teflon filter with 0.2 μm pore size to obtain a film-forming composition of the present invention.

The composition was applied to a silicon wafer by spin coating.

The relative dielectric constant of the film thus obtained was evaluated to confirm a low relative dielectric constant of 2.17. The leakage current of the coating film was less than $3 \times 10^{-10}$ A/cm$^2$, confirming a sufficiently low leakage current.

Example 7

A 1,000 ml three-necked flask equipped with a thermometer, an argon gas feed pipe, and a stirrer was charged with 150 ml of diethylamine, 2.1 g of dichlorobis-triphenylphosphine palladium, 0.286 g of copper iodide, 600 ml of 1,2-dichloroethane, and 185.72 g of 4,4'-bis(2-iodinephenoxy)benzophenone. 65.48 g of 4,4'-diethynyl diphenyl ether was added and the mixture was reacted at 50° C. for 20 hours. 500 g of fresh maleic acid aqueous solution (pH 4) was added to the reaction solution, the mixture was shaken and allowed to stand, and then the separated water layer was discharged. 500 g of fresh distilled water was added to the solution layer, the mixture was again shaken and allowed to stand, and the separated water layer was discharged. 500 g of fresh distilled water was again added to the solution layer, the mixture was shaken and allowed to stand, and the separated water layer was discharged. This procedure was repeated three times to obtain composition G.

The metal content of this solution was analyzed by the flameless atomic absorption method to confirm the metal content of Na (4 ppb), K (2 ppb) Fe (4 ppb), Ca (2 ppb), and Cu (5 ppb). The weight average molecular weight of the resulting polymer was 37,000.

The composition G was filtered through a Teflon filter with 0.2 μm pore size to obtain a film-forming composition of the present invention.

The composition was applied to a silicon wafer by spin coating.

The relative dielectric constant of the film thus obtained was evaluated to confirm a low relative dielectric constant of 2.97. The leakage current of the coating film was less than $1\times10^{-10}$ A/cm$^2$, confirming a sufficiently low leakage current.

Comparative Example 1

A coating film was prepared and evaluated in the same manner as in Example 1, except for using the polymer (2) obtained in Synthesis Example 2.

The relative dielectric constant of the film thus obtained was evaluated to confirm a relative dielectric constant of 2.92. The leakage current of the coating film was $8\times10^{-9}$ A/cm$^2$, indicating poor leakage current properties of the film.

Comparative Example 2

Liquid-liquid extraction of a reaction solution, which was prepared in the same manner as in Synthesis Example 1 except for using methyl ethyl ketone instead of ethyl acetate, was carried out in the same manner as in Example 1 using distilled water. The mixture was not separated into two layers.

Comparative Example 3

The procedure of Example 2 was followed, except that an aqueous solution of ammonia (pH 8) was used instead of the maleic acid aqueous solution (pH 4). The metal content of this solution was analyzed by the flameless atomic absorption method to confirm the metal content of Na (22 ppb), K (5 ppb) Fe (80 ppb), Ca (100 ppb), and Cu (5 ppb). The weight average molecular weight of the resulting polymer was 4,600.

The solution was filtered through a Teflon filter with 0.2 μm pore size to obtain a film-forming composition.

The composition was applied to a silicon wafer by spin coating.

The relative dielectric constant of the film thus obtained was evaluated to confirm a high relative dielectric constant of 3.12. The leakage current of the coating film was $2\times10^{-9}$ A/cm$^2$, indicating poor leakage current properties.

As described above, an insulating film-forming material having a low metal impurity content and capable of forming a silica-based film having excellent relative dielectric constant characteristics and low leakage current characteristics can be provided by a method comprising dissolving polymer components in an organic solvent having a solubility in water of 100 g/100 cc or less at 20° C., and causing the solution to come in contact with water or an acidic aqueous solution to perform liquid—liquid extraction.

Obviously, numerous modifications and variations of the present invention are possible in light of the above teach-ings. It is therefore to be understood that, within the scope of the appended claims, the invention may be practiced otherwise than as specifically described herein.

What is claimed is:

1. An insulating film-forming material comprising dissolving an inorganic polymer compound or an organic polymer compound in an organic solvent having a solubility in water of 100 g/100 cc or less at 20° C., and causing the solution to come in contact with water or an acidic aqueous solution to perform liquid-liquid extraction, wherein said water has ana eletrical resistance of 10 MΩ/cm or higher and said aqueous acidic solution is prepared by mixing an acid water having an electrical resistance of 10 MΩ/cm or greater, wherein the inorganic polymer compound is a compound obtained by hydrolysis and condensation of at least one silane compound selected from the compounds shown by the following formulas (1), (2), or (3) in the presence of a catalyst, $$R_a Si(OR^1)_{4-a} \quad (1)$$

wherein R is a hydrogen atom, fluorine atom, or monovalent organic group, $R^1$ is a monovalent organic group, and a is an integer from 1 to 2.

$$Si(OR^2)_4 \quad (2)$$

wherein $R^2$ represents a monovalent organic group, $$R^3_b(R^4O)_{3-b}Si-(R^7)_d-Si(OR^5)_{3-c}R^6_c \quad (3)$$

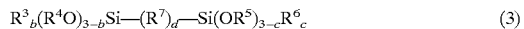

wherein $R^3$, $R^4$, $R^5$, and $R^6$ individually represent a monovalent organic group, b and c individually represent an integer from 0 to 2, $R^7$ represents an oxygen atom, a phenylene group, or a group —$(CH_2)_n$— (wherein n is an integer from 1 to 6), and d is 0 or 1.

2. An insulating film prepared by applying a film-forming material to a substrate and heating said applied film-forming material, wherein said film-forming material is obtained by dissolving inorganic polymer compound or an organic polymer compound in an organic solvent having a solubility in water of 100 g/100 cc or less at 20° C., and causing a solubility in water of 100 g/100 cc or less at 20° C., and causing the solution to come in contact with water or an acidic aqueous solution to perform liquid-liquid extraction, wherein said water has ana eletrical resistance of 10 MΩ/cm or higher and said aqueous acidic solution is prepared by mixing an acid water having an electrical resistance of 10 MΩ/cm or greater, wherein the inorganic polymer compound is a compound obtained by hydrolysis and condensation of at least one silane compound selected from the compounds shown by the following formulas (1), (2), or (3) in the presence of a catalyst, $$R_a Si(OR^1)_{4-a} \quad (1)$$

wherein R is a hydrogen atom, fluorine atom, or monovalent organic group, $R^1$ is a monovalent organic group, and a is an integer from 1 to 2.

$$Si(OR^2)_4 \quad (2)$$

wherein $R^2$ represents a monovalent organic group, $$R^3_b(R^4O)_{3-b}Si-(R^7)_d-Si(OR^5)_{3-c}R^6_c \quad (3)$$

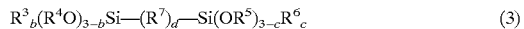

wherein $R^3$, $R^4$, $R^5$, and $R^6$ individually represent a monovalent organic group, b and c individually represent an integer from 0 to 2, $R^7$ represents an oxygen atom, a phenylene group, or a group —$(CH_2)_n$— (wherein n is an integer from 1 to 6), and d is 0 or 1.

3. An insulating film-forming material comprising dissolving an organic polymer compound or an organic polymer compound in an organic solvent having a solubility in water of 100 g/100 cc or less at 20° C., and causing the solution to come in contact with water or an acidic aqueous solution to perform liquid-liquid extraction, wherein the inorganic polymer compound is a compound obtained by hydrolysis and condensation of at least one silane compound selected from the compounds shown by the following formulas (1), (2), or (3) in the presence of a catalyst, $$R_a Si(OR^1)_{4-a} \tag{1}$$

wherein R is a hydrogen atom, fluorine atom, or monovalent organic group, $R^1$ is a monovalent organic group, and a is an integer from 1 to 2.

$$Si(OR^2)_4 \tag{2}$$

wherein $R^2$ represents a monovalent organic group, $$R^3{}_b(R^4O)_{3-b}Si-(R^7)_d-Si(OR^5)_{3-c}R^6{}_c \tag{3}$$

wherein $R^3$, $R^4$, $R^5$, and $R^6$ individually represent a monovalent organic group, b and c individually represent an integer from 0 to 2, $R^7$ represents an oxygen atom, a phenylene group, or a group —$(CH_2)_n$— (wherein n is an integer from 1 to 6), and d is 0 or 1, and said organic polymer has a weight average molecular weight of greater than 900,000.

4. An insulating film prepared by applying a film-forming material to a substrate and heating said applied film-forming material, wherein said film-forming material is obtained by dissolving inorganic polymer compound or an organic polymer compound in an organic solvent having a solubility in water of 100 g/100 cc or less at 20° C., and causing the solution to come in contact with water or an acidic aqueous solution to perform liquid—liquid extraction, wherein the inorganic polymer compound is a compound obtained by hydrolysis and condensation of at least one silane compound selected from the compounds shown by the following formulas (1), (2), or (3) in the presence of a catalyst, $$R_a Si(OR^1)_{4-a} \tag{1}$$

wherein R is a hydrogen atom, fluorine atom, or monovalent organic group, $R^1$ is a monovalent organic group, and a is an integer from 1 to 2.

$$Si(OR^2)_4 \tag{2}$$

wherein $R^2$ represents a monovalent organic group, $$R^3{}_b(R^4O)_{3-b}Si-(R^7)_d-Si(OR^5)_{3-c}R^6{}_c \tag{3}$$

wherein $R^3$, $R^4$, $R^5$, and $R^6$ individually represent a monovalent organic group, b and c individually represent an integer from 0 to 2, $R^7$ represents an oxygen atom, a phenylene group, or a group —$(CH_2)_n$— (wherein n is an integer from 1 to 6), and d is 0 or 1.

said organic polymer has a weight average molecular weight of greater than 900,000.

5. The new insulating film-forming material of claim 1, wherein liquid—liquid extraction is achieved by pouring the solution into water or an aqueous acidic solution and separating a polymer-containing layer from an aqueous layer.

6. The insulating film-forming material of claim 1, wherein the concentration of Na, K, Fe, Co and Cu is less than 20 ppb in the solution contacted with water or the aqueous acidic solution after performing liquid—liquid extraction.

7. The new insulating film-forming material of claim 2, wherein liquid-liquid extraction is achieved by pouring the solution into water or an aqueous acidic solution and separating a polymer-containing layer from an aqueous layer.

8. The insulating film-forming material of claim 2, wherein the concentration of Na, K, Fe, Co and Cu is less than 20 ppb in the solution contacted with water or the aqueous acidic solution after performing liquid—liquid extraction.

9. The insulating film-forming material of claim 1, wherein R or $R^1$ in Formula 1 is an alkyl group or a phenyl group.

10. The insulating film-forming material of claim 2, wherein R or $R^1$ in Formula 1 is an alkyl group or a phenyl group.

11. The insulating film-forming material of claim 1, wherein the silane of Formula 1 is selected from the group consisting of methyltrimethoxysilane, methyltriethoxysilane, methyltri-n-propoxysilane, methylltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

12. The insulating film-forming material of claim 2, wherein the silane of Formula 1 is selected from the group consisting of methyltrimethoxysilane, methyltriethoxysilane, methyltri-n-propoxysilane, methylltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

13. The insulating film-forming material of claim 1, wherein the silane of Formula 2 is selected from the group consisting of tetramethoxysilane, tetraethoxysilane, tetra-n-propoxysilane, tetra-iso-propoxysilane, tetra-n-butoxysilane, tetra-sec-butoxysilane, tetra-tert-butoxysilane and tetraphenoxylsilane.

14. The insulating film-forming material of claim 2, wherein the silane of Formula 2 is selected from the group consisting of tetramethoxysilane, tetraethoxysilane, tetra-n-propoxysilane, tetra-iso-propoxysilane, tetra-n-butoxysilane, tetra-sec-butoxysilane, tetra-tert-butoxysilane and tetraphenoxylsilane.

15. The insulating film-forming material claimed in claim 1, wherein the hydrolysis and condensation of the silane is carried in the presence of water present in an amount of from 0.5 to 150 mols per one mole of the silane.

16. The insulating film-forming material claimed in claim 2, wherein the hydrolysis and condensation of the silane is carried in the presence of water present in an amount of from 0.5 to 150 mols per one mole of the silane.

17. The insulating film-forming material claimed in claim 1, wherein the catalyst is an acid catalyst or an alkali catalyst.

18. The insulating film claimed in claim 2, wherein the catalyst is an acid catalyst or an alkali catalyst.

19. The insulating film-forming material claimed in claim 1, wherein the catalyst is a titanium or aluminum chelating compound.

20. The insulating film claimed in claim 2, wherein the catalyst is a titanium aluminum chelating compound.

21. The insulating film-forming material of claim 1, wherein the solution is contacted with an aqueous alkaline solution.

22. The insulating film of claim 2, wherein the solution is contacted with an aqueous alkaline solution.

\* \* \* \* \*

UNITED STATES PATENT AND TRADEMARK OFFICE
CERTIFICATE OF CORRECTION

PATENT NO. : 6,465,368 B2
DATED : October 15, 2002
INVENTOR(S) : Yasutake Inoue et al.

It is certified that error appears in the above-identified patent and that said Letters Patent is hereby corrected as shown below:

Column 26,
Line 5, "comprising" should read -- obtained by --.
Line 11, "and" should be -- an --.
Line 12, "mixing an acid" should read -- mixing an acid with --.
Line 39, "dissolving inorganic" should read -- dissolving an inorganic --.
Lines 41-42, delete "and causing a solubility in water of 100 g/100 cc or less at 20° C."
Line 45, "and" should read -- an --.
Line 47, "acid water" should read -- acid with water --.

Column 27,
Line 4, "comprising" should read -- obtained by --.
Line 37, "dissolving inorganic" should read -- dissolving an inorganic --.
Line 66, "The new insulating" should read -- The insulating --.

Column 28,
Line 8, "The new insulating film forming material of claim 2" should read -- The insulating film of claim 2 --.
Line 12, The insulating film forming material of claim 2" should read -- The insulating film of claim 2 --.
Line 17, "material of claim 1" should read -- material claimed in claim 1 --.
Line 20, "The insulating film forming material of claim 2" should read -- The insulating film claimed in claim 2 --.
Line 23, "material of claim 1" should read -- material claimed in claim 1 --.
Line 27, "methylltri-iso-propoxysilane" should read -- methyltri-iso-propoxysilane --.
Line 34, "forming material of" should read -- claimed in --.
Line 38, "methylltri-iso-propoxysilane" should read -- methyltri-iso-propoxysilane --.
Line 42, "dietthyldiethoxysilane" should read -- diethyldiethoxysilane --.
Line 45, "material of" should read -- material claimed in --.
Line 50, "tetraphenoxylsilane" should read -- tetraphenoxysilane --.
Line 51, "forming material of" should read -- claimed in --.
Line 56, "tetraphenoxylsilane" should read -- tetraphenoxysilane --.
Line 61, "film forming material claimed" should read -- film claimed --.
Line 63, "carried in the presence" should read -- carried out in the presence --.

UNITED STATES PATENT AND TRADEMARK OFFICE
CERTIFICATE OF CORRECTION

PATENT NO.      : 6,465,368 B2
DATED           : October 15, 2002
INVENTOR(S)     : Yasutake Inoue et al.

It is certified that error appears in the above-identified patent and that said Letters Patent is hereby corrected as shown below:

Column 29,
Line 7, "titanium aluminum" should read -- titanium or aluminum --.

Signed and Sealed this

Twentieth Day of May, 2003

JAMES E. ROGAN
*Director of the United States Patent and Trademark Office*